(12) United States Patent
Lenz et al.

(10) Patent No.: US 10,172,247 B2
(45) Date of Patent: Jan. 1, 2019

(54) HOUSING WITH ELECTRONIC COMPONENTS

(71) Applicant: Hanon Systems, Daejeon (KR)

(72) Inventors: Mario Lenz, Kerpen (DE); Stephan Werker, Merzenich (DE); Eric Rooks, Bonn (DE)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 15/830,714

(22) Filed: Dec. 4, 2017

(65) Prior Publication Data

US 2018/0160556 A1 Jun. 7, 2018

(30) Foreign Application Priority Data

Dec. 5, 2016 (DE) .................. 10 2016 224 118

(51) Int. Cl.
*H05K 5/00* (2006.01)
*H05K 5/02* (2006.01)
*H05K 7/14* (2006.01)

(52) U.S. Cl.
CPC ........... *H05K 5/0217* (2013.01); *H05K 7/142* (2013.01)

(58) Field of Classification Search
CPC ...... H05K 5/0217; H05K 7/142; G06F 1/184; G06F 1/181
USPC ............. 361/730, 752, 796, 800; 174/138 E, 174/138 G
See application file for complete search history.

(56) References Cited

U.S. PATENT DOCUMENTS

| 5,418,685 A | * | 5/1995 | Hussmann | H05K 1/0209 174/377 |
| 5,550,712 A | * | 8/1996 | Crockett | H05K 7/142 174/564 |
| 5,991,164 A | * | 11/1999 | Saito | H01T 4/08 174/51 |
| 6,366,465 B1 | * | 4/2002 | Baur | H05K 7/142 211/41.17 |

FOREIGN PATENT DOCUMENTS

DE 102014211024 A1 12/2015
JP 1997274942 10/1997

* cited by examiner

*Primary Examiner* — Hung S. Bui
(74) *Attorney, Agent, or Firm* — Shumaker, Loop & Kendrick, LLP; James D. Miller

(57) ABSTRACT

An enclosure for electronic components with a base and a capping forming a room for receiving at least one circuit board at least one circuit board support positioned on the base for the support of the at least one circuit board. At least one fastening element attaches the at least one circuit board to the circuit board support through an engagement with the circuit board support, wherein the capping is formed and/or attached to the base in such a manner that room is formed between the fastening element and the capping in such a manner that a detachment of the fastening element from the circuit board support is prevented.

7 Claims, 1 Drawing Sheet

Fig. 1 (Stand der Technik)
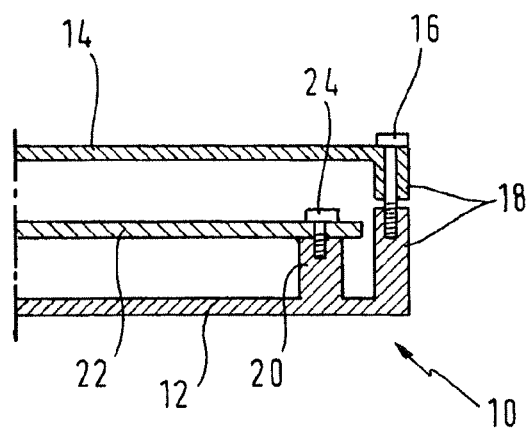
Fig. 2
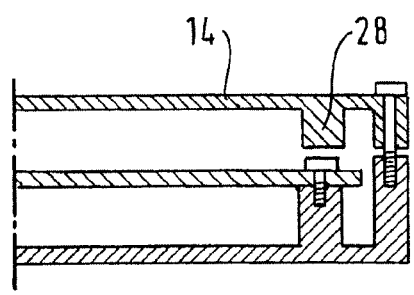
Fig. 3
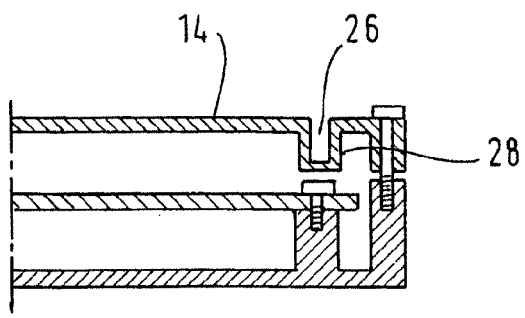

HOUSING WITH ELECTRONIC COMPONENTS

CROSS REFERENCE TO RELATED PATENT APPLICATION

This patent application claims priority to German Patent Application No. DE 10 2016 224 118.4 filed Dec. 5, 2016, the entire disclosure of which is hereby incorporated herein by reference.

FIELD

The invention pertains to an enclosure with electronic components arranged on at least one circuit board.

BACKGROUND

Circuit boards on which electronic components are installed are typically connected by way of screws. There is a problem, however, that due to vibrations and/or material creepage and/or thermal load changes and the resulting expansions and contractions of the material, for instance, the screws may come loose. This is not only disadvantageous in terms of the deteriorating attachment of the circuit board, but loose screws in such an enclosure may damage the electronic components and/or lead to short circuits, causing the failure of the respective electronics.

From DE 10 2014 211 024 A1, a screw locking device is known, which requires additional components and is therefore comparatively complex.

Alternatively, it is known that such screws can be glued in their respective screw openings by means of a suitable adhesive, which also involves an increased expenditure in terms of the production of such an enclosure with electronic components in it.

SUMMARY

Against this background, the task underlying the invention is to provide a reliably functional enclosure with electronic components installed on at least one circuit board, which features, moreover, a comparatively simple design.

The solution of the task is accomplished by way of the enclosure shown and described herein.

Accordingly, at least one circuit board with electronic components installed on it by means of at least one fastening element, such as a screw, for instance, is attached on the inside of the enclosure. While clips or other fasteners are conceivable as fastening elements, currently screws are favored, and the following description relates to screws as the fastening element. It should be emphasized, however, that all suitable fastening elements are conceivable, and that the invention unfolds the described advantages for them as well.

According to the invention, one enclosure part is formed and/or installed in the form of a capping in such a manner that a space between the screw and the enclosure part is constituted, and specifically, dimensioned and/or delimited, such that a screw that has come loose cannot exit its opening. This is essentially accomplished by a distance between the external end of the screw, in other words, the end that is removed from the screw opening, on the one hand, and the enclosure part, on the other hand, which, when measured in the axial direction of the screw, is smaller than the length of the screw in the screw opening. Accordingly, the external end of the screw pushes against the enclosure part before the screw fully exits the screw opening. Therefore, the screw is unable to exit its screw opening, and the screw cannot be loose in the inside of the enclosure.

As a result, the aforementioned problems are avoided without a need for additional components. Specifically, as described in greater detail below, the structure required of the enclosure part to limit the space above the screw is simple to produce, so that the production expenditure for the enclosure according to the invention is not increased. For instance, the enclosure may be made out of a synthetic material, specifically by way of injection molding, allowing for the manufacturing of the necessary structures at a comparatively low cost.

Moreover, there is no need for further space, such as is needed for the additional components used in the prior art. Furthermore, any gaps needed for the isolation and delimitation of the electronic components can be implemented in a particularly easy manner by way of the measure according to the invention. Therefore, the available space can be used particularly efficiently for the installation of electronic components. Overall, the invention provides a cost-effective and particularly a more reliable enclosure for electronics, which specifically is only moderately susceptible to vibrations, which might be noise vibrations or other vibrations (Noise Vibration Harshness, NVH).

With respect to the circuit board, it should be mentioned that this may be a printed circuit board (PCB), with circuits printed on it. However, the electronic components may also be positioned on any other type of board, and specifically, a board that is not necessarily entirely flat. The use of the term "circuit board" here includes for these purposes any substrate on which electronic components are installed.

Preferred further developments of the enclosure according to the invention are shown and described herein.

For the enclosure part securing the screw(s), favorable results have been obtained when it is free of electronic components. It is also conceivable, however, that a component designated as an enclosure part, which is a carrier of electronic components in its own right, is formed and/or installed in such a manner that it secures at least one screw of a circuit board.

For at least one circuit board support, it may be a ridge or a pin protruding from the base. Such a construction is comparatively easy to produce, and moreover, it meets the requirements in an advantageous manner.

According to initial considerations, at least one protrusion is envisioned on the capping, which, if, for instance, detachment is "upward", is arranged above the fastening element in a direction in which the fastening element detaches from the circuit board support in such a manner that a release of the fastening element from the circuit board support is prevented.

For these purposes, it has proven to be advantageous that at least one protrusion be designed as hollow, which adds additional stability to the enclosure.

Currently, an essentially cylindrical protrusion which might also be described as a pin or a bolt provides favorable results, and in particular may be one that is hollow.

BRIEF DESCRIPTION OF THE DRAWINGS

Exemplary embodiments of the invention are further explained below. The figures show as follows:

FIG. 1 shows a fragmentary sectional view of a part of a conventional enclosure for electronics;

FIG. 2 shows a fragmentary sectional view of a part of an electronic component according to the invention in one embodiment; and FIG. 3 shows a fragmentary sectional view of a part of an electronic component according to the invention in another embodiment.

DESCRIPTION OF EMBODIMENTS OF THE INVENTION

As shown in FIG. 1, an enclosure 10 for electronic components that underlies the present invention features a base 12 as well as a capping 14. The capping 14 is typically attached to the base 12 by means of multiple screws, of which only one screw 16 is identified in FIG. 1. In order to create a sufficiently large interior space, both the base 12 and the capping 14 feature ridges 18 oriented towards each other, in the region of which the screw 16 is located. In the interior of the enclosure, a circuit board 22 is attached on an additional ridge or on multiple pins or protrusions 20 by means of a screw 24 that is inserted into an aperture of the circuit board 22 and screwed into a screw opening in the protrusion 20. In practice, the circuit board 22 is typically attached by means of multiple screws, of which only one is identifiable in FIG. 1. FIG. 1 makes it clear that in the event that the screw detaches itself from the screw opening, it can move within the interior of the enclosure.

This is prevented by the design according to the invention shown in FIG. 2. The enclosure according to the invention features a construction corresponding to that of prior art and therefore not described again, except that in the case shown, the capping 14 features a pin or protrusion 28 which limits the room "above" the screw, which presses against the head of the screw in a direction away from the screw opening. Specifically, the room available here is smaller than the length by which the screw 24 is screwed into its screw opening. If it would subsequently become loosened, it would press against the free end of the pin 28 before being able to fully exit the screw opening. Loose screws in the enclosure can therefore be reliably avoided.

This equally applies to the second embodiment shown in FIG. 3, in which the pin 28 features a cavity 26, or in other words, is hollow. Specifically, in this context, the wall thickness of the capping 14 can be continued in the area of the pin 24, thereby avoiding an accumulation of material, and moreover, providing the capping 14 with increased stability. Furthermore, the capping 14 according to FIG. 3 may extend at the level of the end of the protrusion "above" the screw 24 to the right, and be attached by means of a shorter screw, in order to have the same effects.

It should be further noted about the figures that the electronic components typically installed on the circuit board 22 are not shown.

What is claimed is:

1. An enclosure for electronic components, the enclosure comprising:
    a base;
    a capping engaging the base, the base and the capping forming a room for receiving at least one circuit board;
    at least one circuit board support positioned on the base supporting the at least one circuit board; and
    at least one fastening element attaching the at least one circuit board to the at least one circuit board support through an engagement with the at least one circuit board support, the at least one fastening element including an internal portion disposed within an opening of the at least one circuit board support and an external end disposed outside of the opening of the at least one circuit board support, wherein a space is present between the external end of the at least one fastening element and the capping, wherein a distance between the external end of the at least one fastening element and the capping as measured across the space in an axial direction of the at least one fastening element is smaller than a length of the internal portion of the at least one fastening element disposed within the opening of the at least one circuit board support in a manner wherein a detachment of the at least one fastening element from the at least one circuit board support is prevented.

2. The enclosure according to claim 1, wherein the capping is free of electronic components.

3. The enclosure according to claim 1, wherein the at least one fastening element is a screw.

4. The enclosure according to claim 1, wherein the at least one circuit board support is a ridge or a pin protruding from the base.

5. The enclosure according to claim 1, further comprising at least one protrusion on the capping arranged above the at least one fastening element in such a manner that the detachment of the at least one fastening element of the at least one circuit board support is prevented, wherein the space is present between the external end of the at least one fastening element and the at least one protrusion on the capping.

6. The enclosure according to claim 5, wherein the at least one protrusion is hollow.

7. The enclosure according to claim 5, wherein the at least one protrusion is cylindrical.

* * * * *